(12) United States Patent
Kwon et al.

(10) Patent No.: US 10,326,110 B2
(45) Date of Patent: Jun. 18, 2019

(54) ORGANIC LIGHT EMITTING DISPLAY DEVICE

(71) Applicant: LG Display Co., Ltd., Seoul (KR)

(72) Inventors: SeYeoul Kwon, Goyang-si (KR); Saemleenuri Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 504 days.

(21) Appl. No.: 15/139,202

(22) Filed: Apr. 26, 2016

(65) Prior Publication Data

US 2017/0125733 A1 May 4, 2017

(30) Foreign Application Priority Data

Oct. 29, 2015 (KR) ........................ 10-2015-0150873

(51) Int. Cl.
*H01L 51/52* (2006.01)
*H01L 27/32* (2006.01)
*H01L 51/00* (2006.01)

(52) U.S. Cl.
CPC ...... *H01L 51/5256* (2013.01); *H01L 27/3258* (2013.01); *H01L 51/0097* (2013.01); *H01L 51/5253* (2013.01); *H01L 27/3244* (2013.01); *H01L 2227/323* (2013.01)

(58) Field of Classification Search
None
See application file for complete search history.

(56) References Cited

U.S. PATENT DOCUMENTS

| | | |
|---|---|---|
| 2003/0168966 A1 | 9/2003 | Kobayashi et al. |
| 2004/0212759 A1 | 10/2004 | Hayashi |
| 2004/0232832 A1 | 11/2004 | Kubota |
| 2007/0122928 A1 | 5/2007 | Hayashi |
| 2014/0138674 A1 | 5/2014 | Sato et al. |
| 2014/0252328 A1 | 9/2014 | Takamatsu |
| 2015/0060778 A1 | 3/2015 | Kim et al. |
| 2015/0214504 A1 | 7/2015 | Sonoda et al. |
| 2016/0293884 A1* | 10/2016 | Zhang ................ H05B 33/0896 |

FOREIGN PATENT DOCUMENTS

| | | |
|---|---|---|
| EP | 1460697 A2 | 9/2004 |
| JP | 2003017244 | 1/2003 |
| JP | 2003282239 | 10/2003 |
| JP | 2004327262 A | 11/2004 |
| JP | 2004327402 | 11/2004 |
| JP | 2005267983 | 9/2005 |
| JP | 2007128741 | 5/2007 |

* cited by examiner

*Primary Examiner* — Michelle Mandala
(74) *Attorney, Agent, or Firm* — Fenwick & West LLP

(57) ABSTRACT

An organic light emitting display device is presented which prevents water from penetrating through an outermost side of a display panel, thereby enhancing reliability of first thin film transistors (TFTs). The organic light emitting display device includes a base substrate, a first buffer layer disposed on the base substrate, a TFT disposed on the first buffer layer in a display area, a second TFT disposed on the first buffer layer in a non-display area, an organic light emitting diode (OLED) disposed on the first TFT, and an encapsulation layer disposed on the OLED, the second TFT, and the first buffer layer. The first buffer layer and the encapsulation layer each include the same material, for example, silicon oxynitride (SiON).

22 Claims, 8 Drawing Sheets

ORGANIC LIGHT EMITTING DISPLAY DEVICE

CROSS-REFERENCE TO RELATED APPLICATIONS

This application claims the benefit of Republic of Korea Patent Application No. 10-2015-0150873 filed on Oct. 29, 2015, which is hereby incorporated by reference as if fully set forth herein.

BACKGROUND

Field of the Invention

The present invention relates to an organic light emitting display device, and more particularly, to an organic light emitting display device for enhancing reliability of thin film transistors.

Discussion of the Related Art

As the times advance to the information-oriented society, flat panel display (FPD) devices which have good characteristics such as thin profile, lightness, and low power consumption are increasing in importance. Examples of FPD devices include liquid crystal display (LCD) devices, plasma display panels (PDPs), organic light-emitting display devices, etc. Recently, electrophoretic display (EPD) devices are also being widely used as one type of FPD device.

In the flat panel display devices, LCD devices and organic light emitting display devices including a thin film transistor (TFT) have advantageous properties in resolution, color display, and image quality, and thus are commercialized as display devices for notebook computers, tablet computers, and desktop computers.

In particular, organic light emitting display devices are self-emitting devices, and have low power consumption, a fast response time, high emission efficiency, high luminance, and a wide viewing angle. Therefore, organic light emitting display devices are attracting much attention as next-generation flat panel display devices.

A related art organic light emitting display device includes an organic light emitting display panel, a timing controller, a gate driver, and a data driver. A plurality of gate lines and a plurality of data lines are provided in the organic light emitting display panel, and a plurality of emission parts are respectively provided in intersection areas of the gate lines and the data lines. The timing controller outputs a gate control signal for controlling a gate driver and a data control signal for controlling a data driver. The gate driver sequentially supplies a scan pulse to the gate lines in response to a gate control signal input from the timing controller. The data driver converts image data, input from the timing controller, into analog data voltages and supplies the analog data voltages to the data lines. The gate driver and the data driver are manufactured independently from the organic light emitting display panel and are connected to the gate lines and the data lines in a tape automated bonding (TAB) type.

However, when the gate driver and the data driver are separately manufactured and are connected to the display panel like the related art, a volume of the organic light emitting display device increases, and moreover, the weight of the display device increases. Therefore, recently, the organic light emitting display device is manufactured in a gate-in panel (GIP) structure where the gate driver is built into one side of the display panel. However, in the organic light emitting display device having the GIP structure, the characteristic of TFTs built into the gate driver is degraded due to hydrogen which penetrates through an outer side of the display panel. Also, reliability of a device is degraded due to hydrogen within the display panel.

The above-described background is possessed by the inventor of the application for deriving the invention, or is technology information that has been acquired in deriving the invention. The above-described background is not necessarily known technology disclosed to the general public before the application of the invention.

SUMMARY

Accordingly, the present invention is directed to provide an organic light emitting display device that substantially obviates one or more problems due to limitations and disadvantages of the related art.

An aspect of the present invention is directed to provide an organic light emitting display device which prevents water from penetrating through an outermost side of a display panel, thereby enhancing reliability of TFTs.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device includes a base substrate, a first buffer layer disposed on the base substrate, a first thin film transistor (TFT) disposed on the first buffer layer in a display area, a second TFT disposed on the first buffer layer in a non-display area, an organic light emitting diode (OLED) disposed on the first TFT, and an encapsulation layer disposed on the OLED, the second TFT, and the first buffer layer, wherein the first buffer layer and the encapsulation layer each include the same material.

Embodiments also relate to an organic light emitting display device. The organic light emitting display device includes a substrate and a first buffer layer disposed on the substrate. The first buffer layer includes a first material. A first thin film transistor (TFT) and a second TFT is disposed on the first buffer layer. An organic light emitting diode (OLED) is disposed on the first TFT and is electrically connected to the first TFT. An encapsulation layer is disposed on the OLED, the first TFT, and the first buffer layer. The encapsulation layer also includes the first material. In the organic light emitting display device, at least a portion of the first buffer layer and an edge portion of the encapsulation layer are in contact with each other, or joined together with one or more layers including the first material in between the portion of the first buffer layer and the edge portion of the encapsulation layer, to encapsulate at least the first TFT and the OLED.

In one embodiment, the first material is silicon oxynitride (SiON).

In one embodiment, the substrate is a plastic film.

In one embodiment, a second buffer layer is disposed between the first buffer layer and the first TFT, and between the first buffer layer and the second TFT.

In one embodiment, the first buffer layer includes a plurality of inorganic layers, and a top-most layer of the inorganic layers of the first buffer layer includes the first material.

In one embodiment, an adhesive layer is disposed on the encapsulation layer.

In one embodiment, the adhesive layer includes a metal layer or a barrier film.

In one embodiment, the one or more layers includes a passivation layer provided between the first buffer layer and the encapsulation layer. The passivation layer covers the first TFT and the first buffer layer, and the passivation layer includes the first material.

In one embodiment, the one or more layers further includes an interlayer dielectric provided between the first buffer layer and the passivation layer, and the interlayer dielectric includes the first material.

In one embodiment, the encapsulation layer includes a plurality of inorganic layers and a plurality of organic layers alternately stacked in between the plurality of inorganic layers. Each of the plurality of inorganic layers includes the first material.

In one embodiment, an edge portion of a top-most layer of the encapsulation layer is in contact with the portion of the first buffer layer.

In one embodiment, the plurality of inorganic layers includes a top-most layer of the encapsulation layer and a bottom-most layer of the encapsulation layer.

Embodiments also relate to an organic light emitting display device including a substrate, a first buffer layer disposed on the substrate. The first buffer layer includes silicon oxynitride (SiON). One or more thin film transistors are disposed over the first buffer layer. An organic light emitting diode (OLED) is disposed over and electrically coupled with at least one of said thin film transistors. An encapsulation layer is disposed over the one or more thin film transistors and the OLED. The encapsulation layer also includes SiON. In the organic light emitting display device, at least a portion of the first buffer layer and an edge portion of the encapsulation layer are in contact with each other, or are joined together with one or more layers including SiON in between the portion of the first buffer layer and the edge portion of the encapsulation layer to encapsulate the one or more thin film transistors and the OLED.

In one embodiment, a second buffer layer is disposed between the first buffer layer and the one or more thin film transistors.

In one embodiment, the first buffer layer includes a plurality of inorganic layers. A top-most layer of the inorganic layers of the first buffer layer includes SiON.

In one embodiment, the one or more layers includes a passivation layer provided between the first buffer layer and the encapsulation layer. The passivation layer covers the one or more thin film transistors and includes SiON.

In one embodiment, the one or more layers further includes an interlayer dielectric provided between the first buffer layer and the passivation layer, and the interlayer dielectric includes SiON.

In one embodiment, the encapsulation layer includes a plurality of inorganic layers and a plurality of organic layers alternately stacked in between the plurality of inorganic layers. Each of the plurality of inorganic layers includes SiON.

In one embodiment, the plurality of inorganic layers includes a top-most layer of the encapsulation layer and a bottom-most layer of the encapsulation layer.

In one embodiment, an edge portion of a top-most layer of the encapsulation layer is in contact with the portion of the first buffer layer.

Embodiments also relate to a method of manufacturing an organic light emitting display device. A first buffer layer is formed on a substrate. The first buffer layer includes silicon oxynitride (SiON). One or more thin film transistors are formed and disposed over the first buffer layer. An organic light emitting diode (OLED) is formed and disposed over and electrically coupled to at least one of said thin film transistors. An encapsulation layer is formed over the one or more thin film transistors and the OLED. The encapsulation layer also includes SiON. At least a portion of the first buffer layer and an edge portion of the encapsulation layer are in contact with each other, or joined together with one or more layers including SiON in between the portion of the first buffer layer and the edge portion of the encapsulation layer to encapsulate the one or more thin film transistors and the OLED.

In one embodiment, the substrate is a plastic film.

In one embodiment, a second buffer layer is formed between the first buffer layer and the one or more thin film transistors.

In one embodiment, a plurality of inorganic layers of the first buffer layer is formed, and a top-most layer of the inorganic layers of the first buffer layer includes SiON.

In one embodiment, an adhesive layer is formed on the encapsulation layer.

In one embodiment, the adhesive layer includes a metal layer or a barrier film.

In one embodiment, a passivation layer of the one or more layers is formed between the first buffer layer and the encapsulation layer. The passivation layer covers the one or more thin film transistors and includes SiON.

In one embodiment, an interlayer dielectric of the one or more layers is formed between the first buffer layer and the passivation layer. The interlayer dielectric includes SiON.

In one embodiment, a plurality of inorganic layers and a plurality of organic layers alternately stacked in between the plurality of inorganic layers of the encapsulation layer are formed. Each of the plurality of inorganic layers includes SiON.

In one embodiment, the plurality of inorganic layers includes a top-most layer of the encapsulation layer and a bottom-most layer of the encapsulation layer.

In one embodiment, an edge portion of a top-most layer of the encapsulation layer is in contact with the portion of the first buffer layer.

Embodiments also relate to a method of manufacturing an organic light emitting display device. A first buffer layer is formed on a substrate. The first buffer layer includes a first material. A first thin film transistor (TFT) and a second TFT are formed over the first buffer layer. An organic light emitting diode (OLED) is formed and disposed over the first TFT and electrically connected to the first TFT. An encapsulation layer is formed over the OLED, the first TFT, and the first buffer layer. The encapsulation layer includes the first material. At least a portion of the first buffer layer and an edge portion of the encapsulation layer are in contact with each other, or joined together with one or more layers including the first material in between the portion of the first buffer layer and the edge portion of the encapsulation layer to encapsulate at least the first TFT and the OLED.

In one embodiment, the first material is silicon oxynitride (SiON).

In one embodiment, the substrate is a plastic film.

In one embodiment, a second buffer layer is formed and disposed between the first buffer layer and the first TFT, and between the first buffer layer and the second TFT.

In one embodiment, a plurality of inorganic layers of the first buffer layer is formed. A top-most layer of the inorganic layers of the first buffer layer includes the first material.

In one embodiment, an adhesive layer is formed on the encapsulation layer.

In one embodiment, the adhesive layer includes a metal layer or a barrier film.

In one embodiment, a passivation layer of the one or more layers is formed between the first buffer layer and the encapsulation layer. The passivation layer covers the first TFT and the first buffer layer, and includes the first material.

In one embodiment, an interlayer dielectric of the one or more layers is formed between the first buffer layer and the passivation layer. The interlayer dielectric includes the first material.

In one embodiment, a plurality of inorganic layers and a plurality of organic layers alternately stacked in between the plurality of inorganic layers of the encapsulation layer are formed. Each of the plurality of inorganic layers includes the first material.

In one embodiment, the plurality of inorganic layers includes a top-most layer of the encapsulation layer and a bottom-most layer of the encapsulation layer.

In one embodiment, an edge portion of a top-most layer of the encapsulation layer is in contact with the portion of the first buffer layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
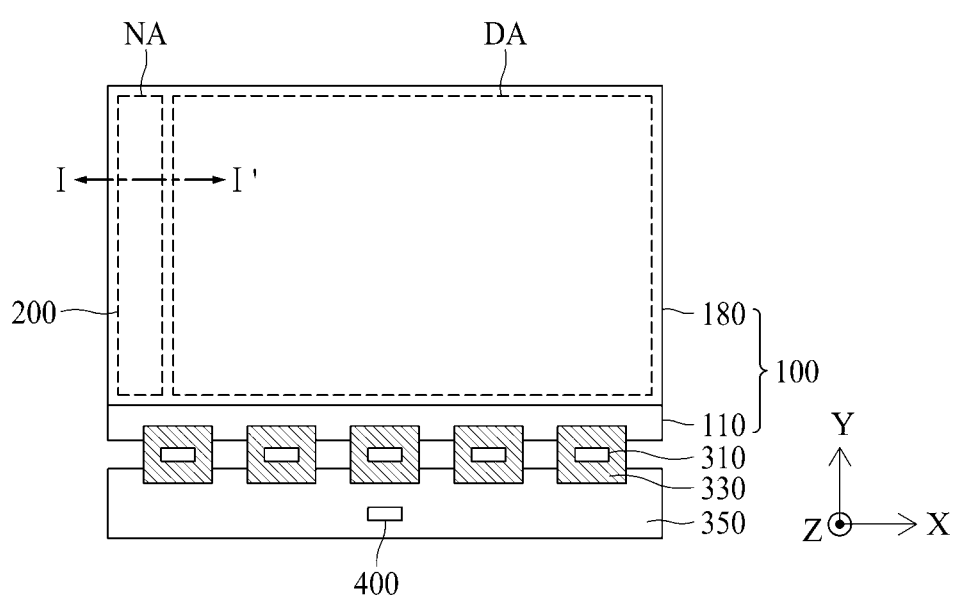
FIG. 1 is a plan view illustrating an organic light emitting display panel, a gate driver, a source drive integrated circuit (IC), a flexible film, a circuit board, and a timing controller included in an organic light emitting display device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of an organic light emitting display device according to embodiments of the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

FIG. 1 is a plan view illustrating an organic light emitting display panel 100, a gate driver 200, a source drive IC 310, a flexible film 330, a circuit board 350, and a timing controller 400 included in an organic light emitting display device according to an embodiment of the present invention.

In FIG. 1, the X axis indicates a direction parallel to a gate line, the Y axis indicates a direction parallel to a data line, and the Z axis indicates a height direction of the organic light emitting display device.

Referring to FIG. 1, the organic light emitting display device according to an embodiment of the present invention may include an organic light emitting display panel 100, a gate driver 200, a source drive IC 310, a flexible film 330, a circuit board 350, and a timing controller 400.

The organic light emitting display panel 100 may include a base substrate 110 and an encapsulation layer 180.

A plurality of gate lines and a plurality of data lines may be formed in a display area DA of the base substrate 110, and a plurality of emission parts may be respectively provided in intersection areas of the gate lines and the data lines. The emission parts provided in the display area DA may display an image.

A non-display area NA of the base substrate 110 may be disposed on one edge of the display area DA. The gate driver 200 including a plurality of TFTs may be provided in the non-display area NA.

The encapsulation layer 180 may cover a top of the base substrate 110. The encapsulation layer 180 protects elements provided on the base substrate 110 and prevents water from penetrating into the organic light emitting display panel 100. The encapsulation layer 180 may be formed smaller in size than the base substrate 110, and thus, a portion of the base substrate 110 may be exposed without being covered by the encapsulation layer 180.

The organic light emitting display panel 100 will be described in detail with reference to embodiments of FIGS. 2 to 6.

The gate driver 200 may sequentially supply gate signals to the gate lines according to a gate control signal input from the timing controller 400. In an embodiment of the present invention, the gate driver 200 is disclosed as being provided outside one side of the display area DA of the organic light emitting display panel 100 in a gate driver in panel (GIP) type, but is not limited thereto. That is, the gate driver 200 may be provided outside each of both sides of the display area DA of the organic light emitting display panel 100 in the GIP type, or may be manufactured as a driving chip, mounted on a flexible film, and attached to the organic light emitting display panel 100 in a tape automated bonding (TAB) type.

The source drive IC 310 may receive digital video data and a source control signal from the timing controller 400. The source drive IC 310 may convert the digital video data into analog data voltages according to the source control signal and may respectively supply the analog data voltages to the data lines. When the source drive IC 310 is manufactured as a driving chip, the source drive IC 310 may be mounted on the flexible film 330 in a chip on film (COF) type or a chip on plastic (COP) type.

A portion of the base substrate 110 may be exposed without being covered by the encapsulation layer 180. A plurality of pads such as data pads or the like may be provided in the portion of the base substrate 110 which is exposed without being covered by the encapsulation layer 180. A plurality of lines connecting the pads to the source drive IC 310 and a plurality of lines connecting the pads to lines of the circuit board 350 may be provided in the flexible film 330. The flexible film 330 may be attached to the pads by using an anisotropic conductive film (ACF), and thus, the pads may be connected to the lines of the flexible film 330.

The circuit board 350 may be attached to a plurality of the flexible films 330. A plurality of circuits which are respectively implemented as a plurality of driving chips may be mounted on the circuit board 350. For example, the timing controller 400 may be mounted on the circuit board 350. The circuit board 350 may be a printed circuit board (PCB) or a flexible printed circuit board (FPCB).

The timing controller 400 may receive digital video data and a timing signal from an external system board (not shown). The timing controller 400 may generate the gate control signal for controlling an operation timing of the gate driver 200 and a source control signal for controlling a plurality of the source drive ICs 310, based on the timing signal. The timing controller 400 may supply the gate control signal to the gate driver 200 and may supply the source control signal to the source drive ICs 310.

Figure 2:
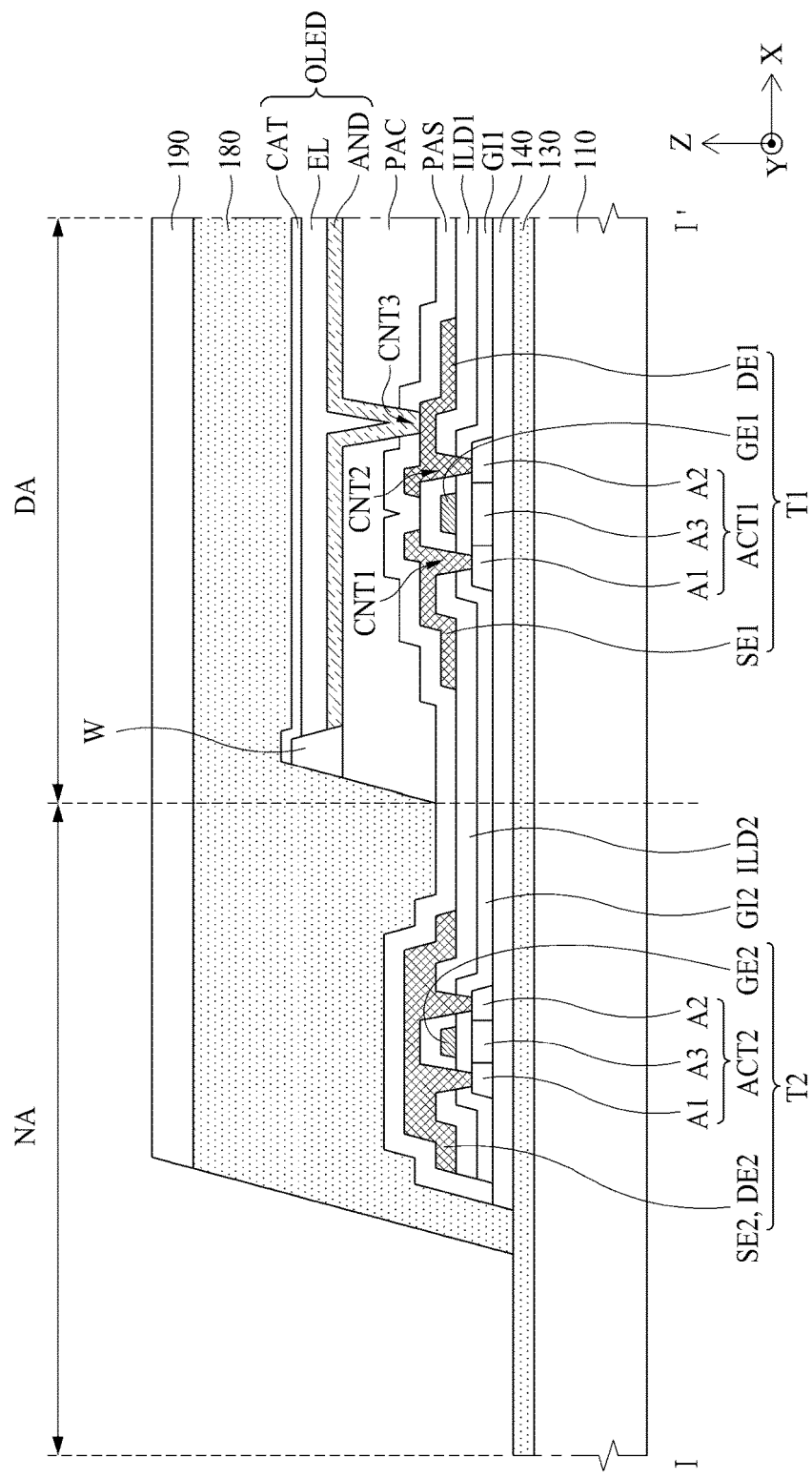
FIG. 2 is a cross-sectional view of an organic light emitting display device according to a first embodiment of the present invention.

FIG. 2 is a cross-sectional view of an organic light emitting display device according to a first embodiment of the present invention. That is, FIG. 2 is a diagram schematically illustrating a cross-sectional surface taken along line I-I' of FIG. 1.

Referring to FIG. 2, the organic light emitting display device according to a first embodiment of the present invention may include a base substrate 110, a first buffer layer 130, a second buffer layer 140, a first TFT T1, a second TFT T2, a passivation layer PAS, a planarization layer PAC, an organic light emitting diode (OLED), and an encapsulation layer 180.

The base substrate 110 may be a transparent glass substrate or a plastic film. For example, the base substrate 110 may be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, or the like, but is not limited thereto.

The first buffer layer 130 may be provided on the base substrate 110. The first buffer layer 130 prevents water from penetrating into the organic light emitting display panel 100 from a base substrate 110 vulnerable to penetration of water. To this end, the first buffer layer 130 may be formed of a plurality of inorganic layers which are alternatively stacked. Each of the plurality of inorganic layers may be formed of silicon dioxide ($SiO_2$), silicon nitride (SiNx), and silicon oxynitride (SiON), or the like, but is not limited thereto.

The first buffer layer 130 according to an embodiment of the present invention may have a stacked structure including $SiO_2$ and SiON which are lower in hydrogen content compared to that of silicon nitride (SiNx). Here, generally, a hydrogen content of SiNx may be between 15% to 20%, a hydrogen content of SiON may be between 5% to 10%, and a hydrogen content of SiOx may be 3% or less. In this case, a layer of SiON may be disposed as an uppermost layer of the first buffer layer 130. Since a water vapor transmission rate of SiON is low, water is prevented from penetrating into the organic light emitting display panel 100 through the base substrate 110. Accordingly, the first and second TFTs T1 and T2 can be prevented from being degraded by water vapor penetration.

The second buffer layer 140 may be provided on the first buffer layer 130. The second buffer layer 140 prevents impurities such as metal ions and/or the like from being diffused from the first substrate 110 and penetrating into an active layer ACT1. Also, the second buffer layer 140 prevents water from penetrating into the organic light emitting display panel 100 and degrading the characteristics of the first and second TFTs T1 and T2. The second buffer layer 140 may be formed smaller in size than the first buffer layer 130, and thus, a top-most layer of the first buffer layer 130 disposed in the non-display area NA may be exposed without being covered by the second buffer layer 140. The second buffer layer 140 may be formed of silicon dioxide ($SiO_2$), silicon oxynitride (SiON), or a multilayer thereof, but is not limited thereto. In this case, the second buffer layer 140 according to an embodiment of the present invention may directly contact the first and second TFTs T1 and T2, and thus, an inorganic layer for minimizing the occurrence of hydrogen may be provided as the second buffer layer 140. Accordingly, the second buffer layer 140 may use $SiO_2$ which is low in content of hydrogen.

The first TFT T1 may be disposed in the display area DA of the base substrate 110. The first TFT T1 may include an active layer ACT1, a gate insulator GI1 a gate electrode GE1, an interlayer dielectric ILD1, a source electrode SE1, and a drain electrode DE1.

The active layer ACT1 may be provided on the second buffer layer 140 disposed in the display area DA. The active layer ACT1 may be provided on the base substrate 110 to overlap the gate electrode GE1. The active layer ACT1 may include one end area A1 which is disposed to contact the source electrode SE1, the other end area A2 which is disposed to contact the drain electrode DE1, and a center area A3 which is disposed between the one end area A1 and the other end area A2. The center area A3 may include a semiconductor material on which a dopant is not doped, and the one end area A1 and the other end area A2 may include a semiconductor material on which a dopant is doped.

The gate insulator GI1 may be provided on the active layer ACT1. The gate insulator GI1 may insulate the active layer ACT1 from the gate electrode GE1. The gate insulator GI1 may cover the active layer ACT1 and may be formed all over the display area DA. The gate insulator GI1 may be formed of an inorganic layer (for example, silicon dioxide ($SiO_2$), silicon oxynitride (SiON), or a multilayer thereof), but is not limited thereto.

The gate electrode GE1 may be provided on the gate insulator GI1. The gate electrode GE1 may overlap the center area A3 of the active layer ACT1 with the gate insulator GI1 therebetween. For example, the gate electrode GE1 may be formed of one of molybdenum (Mo), aluminum (Al), chromium (Cr), gold (Au), titanium (Ti), nickel (Ni), neodymium (Nd), and copper (Cu) or a single layer or a multilayer including an alloy thereof, but is not limited thereto.

The interlayer dielectric ILD1 may be provided on the gate electrode GE1. The interlayer dielectric ILD1 may be provided all over the display area DA including the gate electrode GE1. For example, the interlayer dielectric ILD1 may be formed of an inorganic layer (for example, silicon dioxide ($SiO_2$), silicon oxynitride (SiON), or a multilayer thereof) which is the same as that of the gate insulator GI1, but is not limited thereto.

The source electrode SE1 and the drain electrode DE1 may be disposed on the interlayer dielectric ILD1 to be spaced apart from each other. The gate insulator GI1 and the interlayer dielectric ILD1 may include a first contact hole CNT1, which exposes a portion of the one end area A1 of the active layer ACT1, and a second contact hole CNT2 which exposes a portion of the other end area A2 of the active layer ACT1. The source electrode SE1 may be connected to the one end area A1 of the active layer ACT1 through the first contact hole CNT1, and the drain electrode DE1 may be connected to the other end area A2 of the active layer ACT1 through the second contact hole CNT2.

The second TFT T2 may be provided in the non-display area NA of the base substrate 110. The second TFT T2 may be simultaneously formed through the same process as that of the first TFT T1 and may have the same configuration as that of the first TFT T1. Similarly to the first TFT T1, the second TFT T2 may include an active layer ACT2, a gate insulator GI2, a gate electrode GE2, an interlayer dielectric ILD2, a source electrode SE2, and a drain electrode DE2.

The active layer ACT2 may be provided on the second buffer layer 140 disposed in the non-display area NA. The gate insulator GI2 may extend from the gate insulator GI1 in the display area DA and may be provided on the active layer ACT2 disposed in the non-display area NA. The gate electrode GE2 may be provided on the gate insulator GI2. The interlayer dielectric ILD2 may be provided on the gate electrode GE2. The interlayer dielectric ILD2 may extend from the interlayer dielectric ILD1 in the display area DA. Here, the interlayer dielectric ILD2 according to the first embodiment of the present invention may be disposed on the second buffer layer 130 without contacting the first buffer layer 130. The source electrode SE2 and the drain electrode DE2 may be disposed on the interlayer dielectric ILD2 to be spaced apart from each other, but the present embodiment is not limited thereto. In other embodiments, as in FIG. 2, the source electrode SE2 and the drain electrode DE2 may be connected to each other without being spaced apart from each other.

The configuration of each of the first and second TFTs T1 and T2 is not limited to the above-described example and may be variously modified to a known configuration which is easily implemented by those skilled in the art.

The passivation layer PAS may be provided on the first and second TFTs T1 and T2. The passivation layer PAS protects the first and second TFTs T1 and T2. In this case, the passivation layer PAS disposed in the non-display area NA may be provided on the second buffer layer 140 so as not to contact the first buffer layer 130. Therefore, an outer portion of the first buffer layer 130 may be maintained in a state of being exposed. The passivation layer PAS may be formed of an inorganic layer (for example, silicon dioxide ($SiO_2$), silicon oxynitride (SiON), or a multilayer thereof), but is not limited thereto.

The planarization layer PAC may be provided on the passivation layer PAS disposed in the display area DA. The planarization layer PAC may not be provided on the passivation layer PAS disposed in the non-display area NA. The planarization layer PAC may planarize a top of the base substrate 110 on which the first TFT T1 is provided. For example, the planarization layer PAC may be formed of acryl resin, epoxy resin, phenolic resin, polyamides resin, polyimides resin, and/or the like, but is not limited thereto.

The passivation layer PAS and the planarization layer PAC which are disposed in the display area DA may include a third contact hole CNT3 which exposes the drain electrode DE1 of the first TFT T1. The drain electrode DE may be connected to an anode electrode AND through the third contact hole CNT3.

The organic light emitting diode OLED may be provided on the first TFT T1. The organic light emitting diode OLED may include the anode electrode AND, an organic layer EL, and a cathode electrode CAT.

The anode electrode AND may be connected to the drain electrode DE1 of the first TFT T1 through the third contact hole CNT3 which is provided in the passivation layer PAS and the planarization layer PAC. A partition wall W may be provided between adjacent anode electrodes AND, and thus, the adjacent anode electrodes AND may be electrically insulated from each other by the partition wall W. The partition wall W may be formed of, for example, an organic material such as an organic layer such as polyimides resin, acryl resin, benzocyclobutene (BCB), or the like, but is not limited thereto.

The organic layer EL may be provided on the anode electrode AND. The organic layer EL may include a hole transporting layer, an organic light emitting layer, and an electron transporting layer. Furthermore, the organic layer EL may further include one or more functional layers for enhancing the emission efficiency and/or lifetime of the organic light emitting layer.

The cathode electrode CAT may be provided on the organic layer EL and the partition wall W. When a voltage is applied to the cathode electrode CAT and the anode electrode AND, a hole and an electron may move to the organic light emitting layer through the hole transporting layer and the electron transporting layer and may be combined with each other in the organic light emitting layer to emit light.

The encapsulation layer 180 may be provided on the organic light emitting diode OLED, the second TFT T2, and the first buffer layer 130. The encapsulation layer 180 protects the first and second TFTs T1 and T2 and the organic light emitting diode OLED from external impact and prevents water from penetrating into the organic light emitting display panel 100.

The encapsulation layer 180 according to the first embodiment of the present invention may be formed of the same material as that of the first buffer layer 130. The encapsulation layer 180 may be formed of the same material as that of an inorganic layer disposed as a top-most layer of the first buffer layer 130 among the inorganic layers included in the first buffer layer 130. That is, when the inorganic layer disposed as the top-most layer of the first buffer layer 130 is formed of SiON, the encapsulation layer 180 may be formed of SiON. An end or edge portion of the encapsulation layer 180 disposed in the non-display area NA may contact an exposed outer portion of the first buffer layer 130. Thus, in one embodiment, an end or edge portion of the encapsulation layer 180 and at least a portion of the first buffer layer 130 may be in contact with each other to encapsulate the first TFT T1, second TFT T2, and the OLED. In other embodiments, the edge portion of the encapsulation layer 180 and at least a portion of the first buffer layer 130 may contact each other at a portion between the first TFT T1 and the second TFT T2 to encapsulate the first TFT T1 and the OLED, although not shown in FIG. 2.

In the related art, since the first buffer layer 130 and the encapsulation layer 180 are formed of different materials, an interface adhesive force between the first buffer layer 130 and the encapsulation layer 180 is low, and for this reason, water penetrates between the first buffer layer 130 and the encapsulation layer 180, causing degradation in reliability of the first and second TFTs T1 and T2. On the other hand, according to the first embodiment of the present invention, the encapsulation layer 180 and the first buffer layer 130 may be formed of the same material, thereby increasing an interface adhesive force between the encapsulation layer 180 and the first buffer layer 130 which contact each other in the outer portion of the organic light emitting display panel 100. Therefore, water is more effectively prevented from penetrating into the organic light emitting display panel 100 than the related art where the encapsulation layer and the first buffer layer are formed of different materials. Accordingly, characteristics of the first and second TFTs T1 and T2 are prevented from being degraded, and reliability of the first and second TFTs T1 and T2 is enhanced.

In addition, a front adhesive layer 190 may be provided on the encapsulation layer 180. The front adhesive layer 190 protects the first and second TFTs T1 and T2 and the organic light emitting diode OLED from an external impact and prevents penetration of water. The front adhesive layer 190 according to the first embodiment of the present invention may be a metal layer, but is not limited thereto.

Figure 3:
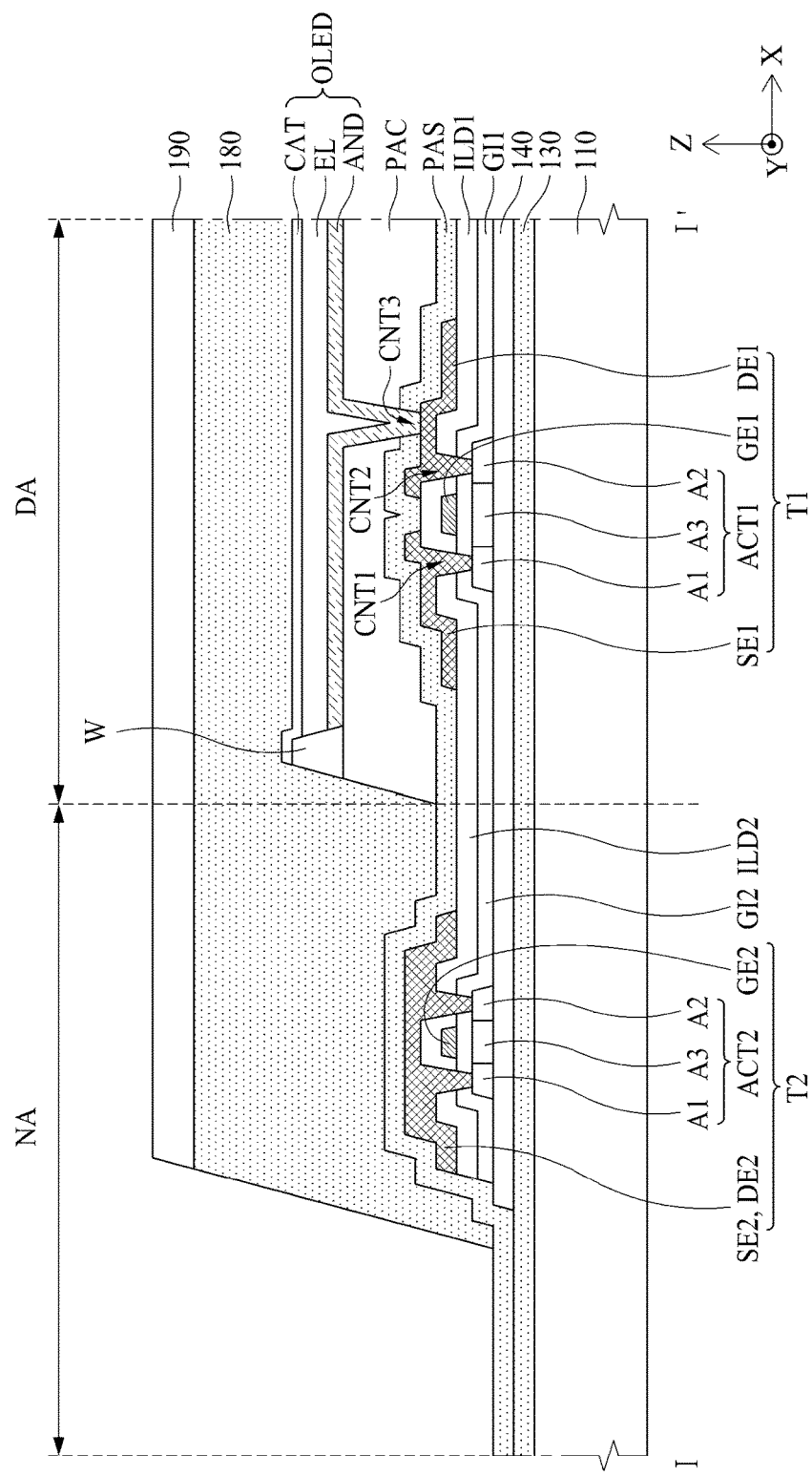
FIG. 3 is a cross-sectional view of an organic light emitting display device according to a second embodiment of the present invention.

FIG. 3 is a cross-sectional view of an organic light emitting display device according to a second embodiment of the present invention. In FIG. 3, a passivation layer PAS extending from the display area DA is additionally provided between the first buffer layer 130 and the encapsulation layer 180 disposed in an outer portion of the non-display area NA in the first embodiment of the present invention described above with reference to FIG. 2. Hereinafter, therefore, the additionally provided passivation layer PAS and a configuration relevant thereto will be described.

Referring to FIG. 3, a passivation layer PAS according to the second embodiment of the present invention may be provided on first and second TFTs T1 and T2. The passivation layer PAS may surround a second buffer layer 140 disposed in a non-display area NA and may cover an exposed outer portion of the first buffer layer 130. In this case, the passivation layer PAS may be formed of the same material as that of the first buffer layer 130. The passivation layer PAS may be formed of the same material as that of a top-most inorganic layer of the first buffer layer 130 among inorganic layers included in the first buffer layer 130. For example, when the inorganic layer disposed as the top-most layer of the first buffer layer 130 is formed of SiON, the passivation layer PAS may be formed of SiON.

An encapsulation layer 180 disposed in the non-display area NA of an organic light emitting display panel 100 according to the second embodiment of the present invention may cover the passivation layer PAS. In this case, the encapsulation layer 180 may be formed of the same material as a material included in the first buffer layer 130 and the passivation layer PAS. Thus, in one embodiment, an end or edge portion of the encapsulation layer 180 and at least a portion of the first buffer layer 130 may be joined together with one or more layers in between the encapsulation layer 180 and the first buffer layer 130 to encapsulate the first TFT, the second TFT, and the OLED. In other embodiments, the edge portion of the encapsulation layer 180 and at least a portion of the first buffer layer 130 may be joined together at a portion between the first TFT and the second TFT with one or more layers in between the encapsulation layer 180 and the first buffer layer 130 to encapsulate the first TFT and the OLED, although not shown in FIG. 3. The one or more layers may include the passivation layer PAS provided on the first TFT T1 and second TFT T2.

According to the second embodiment of the present invention, the passivation layer PAS, the encapsulation layer 180, and the first buffer layer 130 may be formed of the same material, thereby increasing an interface adhesive force between the first buffer layer 130, the passivation layer PAS, and the encapsulation layer 180 which contact each other in an outer portion of the organic light emitting display panel 100. Also, the passivation layer PAS may cover all of the second TFT T2, a second buffer layer 140, and a first buffer layer 130 which are disposed in the non-display area NA, thereby additionally preventing water from penetrating into the organic light emitting display panel 100 from the outer portion of the organic light emitting display panel 100. Accordingly, reliability of the first and second TFTs T1 and T2 is enhanced.

Figure 4:
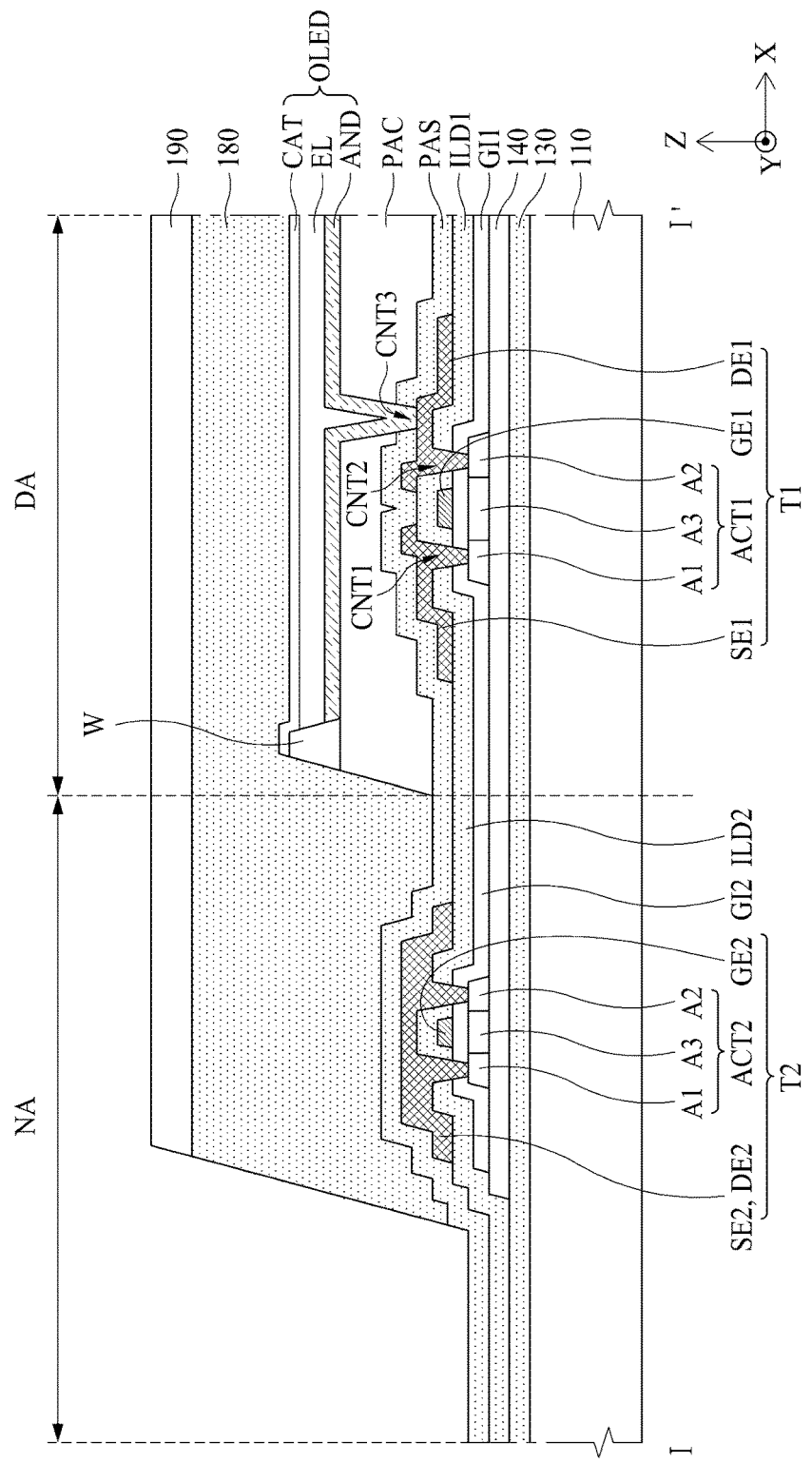
FIG. 4 is a cross-sectional view of an organic light emitting display device according to a third embodiment of the present invention.

FIG. 4 is a cross-sectional view of an organic light emitting display device according to a third embodiment of the present invention. In FIG. 4, an interlayer dielectric ILD is additionally provided between the first buffer layer 130 and the passivation layer PAS disposed in the non-display area NA in the second embodiment of the present invention described above with reference to FIG. 3. Hereinafter, therefore, the additionally provided interlayer dielectric ILD and a configuration relevant thereto will be described.

Referring to FIG. 4, an interlayer dielectric ILD2 may be provided in a non-display area NA of an organic light emitting display panel 100 according to the third embodiment of the present invention. According to the third embodiment of the present invention, the interlayer dielectric ILD2 may surround a second buffer layer 140 disposed in the non-display area NA and may cover an exposed outer portion of the first buffer layer 130. In this case, the interlayer dielectric ILD2 may be formed of the same material as that of the first buffer layer 130. The interlayer dielectric ILD2 may be formed of the same material as that of an inorganic layer disposed as a top-most layer of the first buffer layer 130 among inorganic layers included in the first buffer layer 130. For example, when the inorganic layer disposed as the top-most layer of the first buffer layer 130 is formed of SiON, the interlayer dielectric ILD2 may be formed of SiON.

A passivation layer PAS may be provided on the interlayer dielectric ILD2. The passivation layer PAS may cover a top surface of the interlayer dielectric ILD2. The passivation layer PAS may be formed of the same inorganic layer as that of the interlayer dielectric ILD2. Thus, in one embodiment, an end or edge portion of the encapsulation layer 180 and at least a portion of the first buffer layer 130 may be joined together with one or more layers in between the encapsulation layer 180 and the first buffer layer 130 to encapsulate the first TFT T1, second TFT T2, and the OLED. In other embodiments, the edge portion of the encapsulation layer 180 and at least a portion of the first buffer layer 130 may be joined together at a portion between the first TFT T1 and the second TFT T2 with one or more layers in between the encapsulation layer 180 and the first buffer layer 130 to encapsulate the first TFT T1 and the OLED, although not shown in FIG. 4. The one or more layers may include the passivation layer PAS and the interlayer dielectric ILD2 in between the first buffer layer 130 and the passivation layer PAS.

According to the third embodiment of the present invention, the interlayer dielectric ILD2, the passivation layer PAS, an encapsulation layer 180, and the first buffer layer 130 may be formed of the same material, thereby increasing an interface adhesive force between the first buffer layer 130, the interlayer dielectric ILD2, the passivation layer PAS, and the encapsulation layer 180 which contact each other in an outer portion of the organic light emitting display panel 100. Also, the interlayer dielectric ILD2 may cover all of a second TFT T2, a second buffer layer 140, and the first buffer layer 130 which are disposed in the non-display area NA, thereby additionally preventing water from penetrating into the organic light emitting display panel 100 from the outer portion of the organic light emitting display panel 100. Accordingly, reliability of a first TFT T1 and the second TFT T2 is enhanced.

Figure 5:
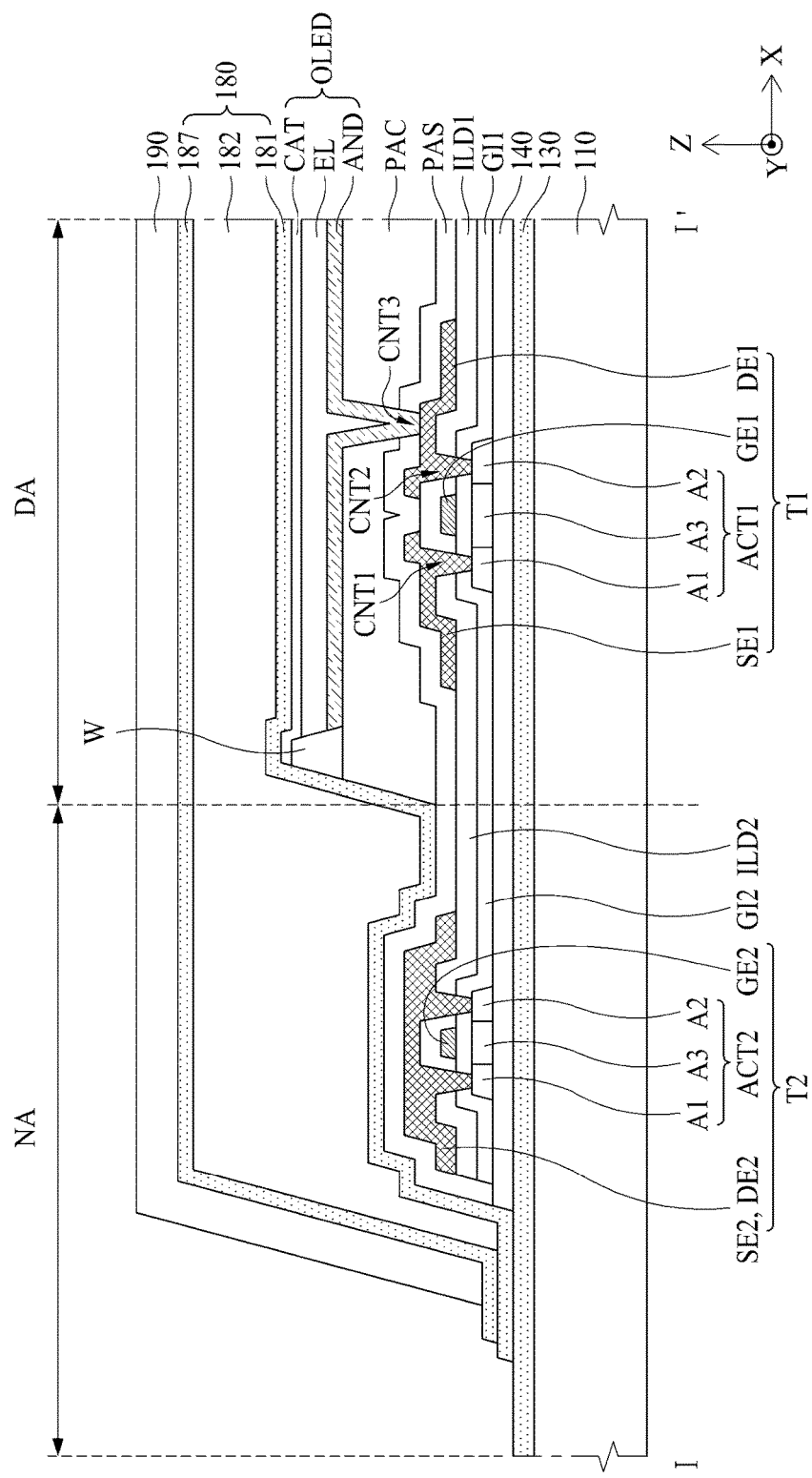
FIG. 5 is a cross-sectional view of an organic light emitting display device according to a fourth embodiment of the present invention.

FIG. 5 is a cross-sectional view of an organic light emitting display device according to a fourth embodiment of the present invention. That is, FIG. 5 illustrates an encapsulation layer 180 which is newly provided by modifying elements of the encapsulation layer 180 according to the first embodiment of the present invention described above with reference to FIG. 2. Hereinafter, the newly provided encapsulation layer 180 and a configuration relevant thereto will be described.

Referring to FIG. 5, an encapsulation layer 180 according to the fourth embodiment of the present invention may have a structure where a plurality of inorganic layers 181 and 187 and an organic layer 182 are alternately stacked. That is, the encapsulation layer 180 may include the plurality of inorganic layers 181 and 187 and the organic layer 182 disposed between the inorganic layers 181 and 187.

The plurality of inorganic layers 181 and 187 may include a lower inorganic layer 181 and an upper inorganic layer 187. The lower inorganic layer 181 may cover an organic light emitting diode OLED, a second TFT T2, a second buffer layer 140, and a first buffer layer 130. The upper inorganic layer 187 may be provided on the lower inorganic layer 181, and an outer portion of the upper inorganic layer 187 may contact an outer portion of the lower inorganic layer 181. In this case, the lower inorganic layer 181 and the upper inorganic layer 187 may each be formed of the same material as that of the first buffer layer 130. The lower inorganic layer 181 and the upper inorganic layer 187 may each be formed of the same material as that of an inorganic layer disposed in a top-most layer of the first buffer layer 130 among inorganic layers included in the first buffer layer 130. That is, when the inorganic layer disposed as the top-most layer of the first buffer layer 130 is formed of SiON, the lower inorganic layer 181 and the upper inorganic layer 187 may each be formed of SiON.

The organic layer 182 may be disposed between the lower inorganic layer 181 and the upper inorganic layer 187. The organic layer 182 may planarize a top surface of the lower inorganic layer 181. For example, the organic layer 182 may be formed of acryl resin, epoxy resin, phenolic resin, polyamides resin, polyimides resin, and/or the like, but is not limited thereto.

In the fourth embodiment of the present invention, the encapsulation layer 180 which includes the plurality of inorganic layers 181 and 187 and the organic layer 182 disposed between the inorganic layers 181 and 187 is described, but a structure of the encapsulation layer 180 is not limited thereto. That is, the structure of the encapsulation layer 180 may be variously modified into a structure where a plurality of inorganic layers and a plurality of organic layers are alternately stacked in between the plurality of inorganic layers. However, an inorganic layer having a low water vapor transmission rate may be disposed in each of a top-most layer and a bottom-most layer of the encapsulation layer 180, for effective water vapor transmission prevention. Also, at least one of a plurality of inorganic layers 181 and 187 included in the encapsulation layer 180 may contact an exposed outer portion of the first buffer layer 130. Thus, an end or edge portion of at least one of the plurality of inorganic layers in the encapsulation layer 180 and at least a portion of the first buffer layer 130 may be in contact with each other or may be joined together with one or more layers in between the encapsulation layer 180 and the first buffer layer 130 to encapsulate the first TFT T1, second TFT T2, and the OLED. In other embodiments, the edge portion of the encapsulation layer 180 and at least a portion of the first buffer layer 130 may be joined together at a portion between the first TFT T1 and the second TFT T2 with one or more layers in between the encapsulation layer 180 and the first buffer layer 130 to encapsulate the first TFT T1 and the OLED, although not shown in FIG. 5. The one or more layers may include the passivation layer PAS provided on the first TFT T1 and second TFT T2. The one or more layers may include any other inorganic layer of the plurality of inorganic layers of the encapsulation layer 180.

In addition, a front adhesive layer 190 may be provided on the encapsulation layer 180 according to the fourth embodiment of the present invention. The front adhesive layer 190 protects a first TFT T1 and the second TFT T2 and the organic light emitting diode OLED from an external impact and prevents penetration of water. The front adhesive layer 190 according to the fourth embodiment of the present invention may be a barrier film layer, but is not limited thereto.

According to the fourth embodiment of the present invention, the encapsulation layer 180 which includes the plurality of inorganic layers 181 and 187 and the organic layer 182 disposed between the inorganic layers 181 and 187 may be provided, and the inorganic layers 181 and 187 may each be formed of the same material as that of the first buffer layer 130, thereby increasing an interface adhesive force between the encapsulation layer 180 and the first buffer layer 130 which contact each other in an outermost portion of an organic light emitting display panel 100. Therefore, water is prevented from penetrating into the organic light emitting display panel 100 from the outside. Accordingly, characteristic of the first and second TFTs T1 and T2 is prevented from being degraded, and reliability of the first and second TFTs T1 and T2 is enhanced.

Figure 6:
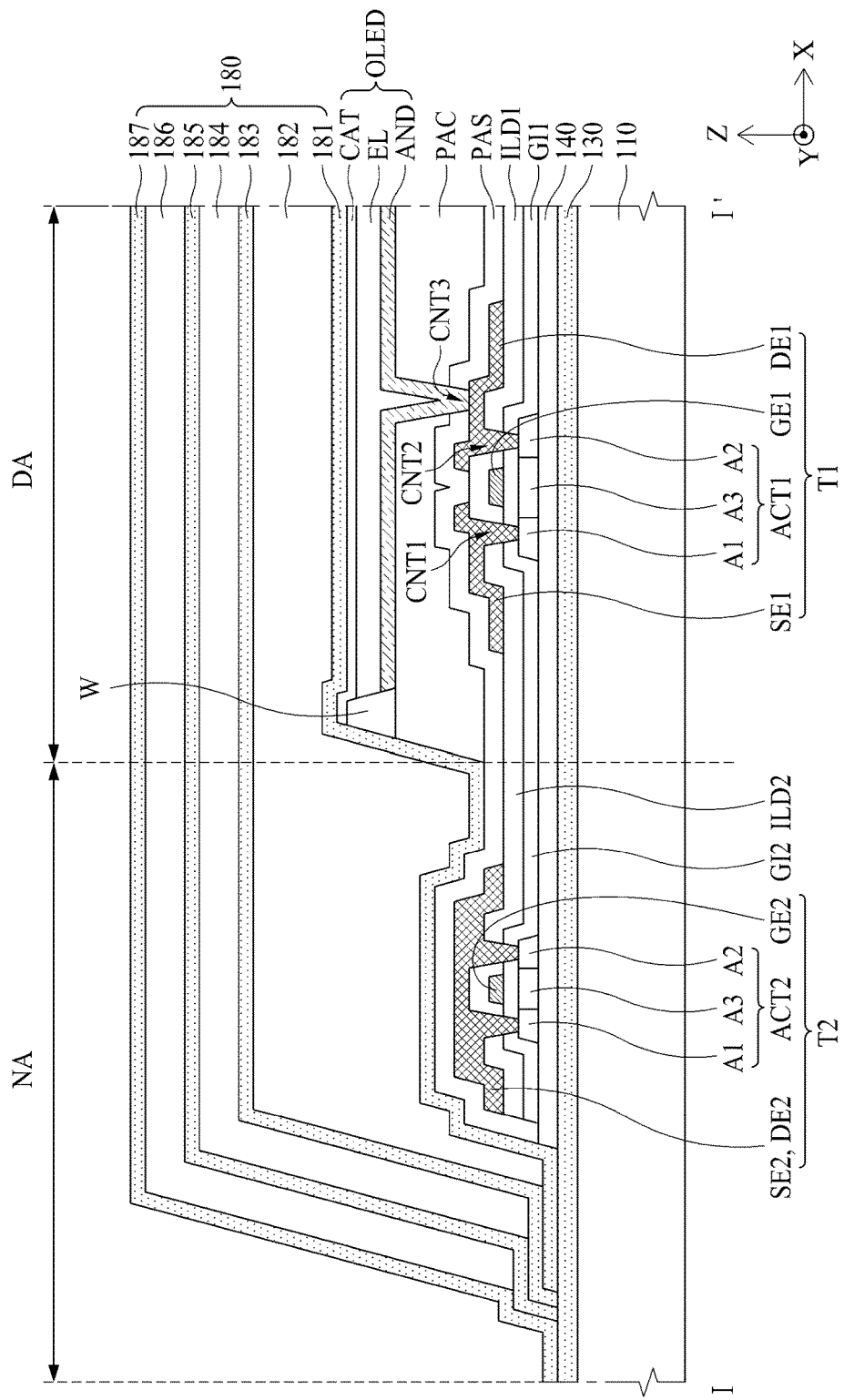
FIG. 6 is a cross-sectional view of an organic light emitting display device according to a fifth embodiment of the present invention.

FIG. 6 is a cross-sectional view of an organic light emitting display device according to a fifth embodiment of the present invention. That is, FIG. 6 illustrates an encapsulation layer 180 which is newly provided by modifying elements of the encapsulation layer 180 according to the first embodiment of the present invention described above with reference to FIG. 2. Hereinafter, the newly provided encapsulation layer 180 and a configuration relevant thereto will be described.

Referring to FIG. 6, an encapsulation layer 180 according to the fifth embodiment of the present invention may include a plurality of inorganic layers 181, 183, 185 and 187 and a plurality of organic layers 182, 184 and 186 which are alternately stacked. The plurality of organic layers 182, 184 and 186 may be disposed between the plurality of inorganic layers 181, 183, 185 and 187.

A lower inorganic layer 181 disposed as a bottom-most layer of the encapsulation layer 180 among the plurality of inorganic layers 181, 183, 185 and 187 may cover an organic light emitting diode OLED, a second TFT T2, a second buffer layer 140, and a first buffer layer 130.

An upper inorganic layer 187 disposed as a top-most layer of the encapsulation layer 180 among the plurality of inorganic layers 181, 183, 185 and 187 may surround the other inorganic layers 181, 183 and 185 and the plurality of organic layers 182, 184 and 186 and may cover the first buffer layer 130.

Therefore, an outer portion of an organic light emitting display panel 100 may be sealed by the encapsulation layer 180 and the first buffer layer 130. In this case, the plurality of inorganic layers 181, 183, 185 and 187 may each be formed of the same material as that of the first buffer layer 130. The plurality of inorganic layers 181, 183, 185 and 187 may each be formed of the same material as that of an inorganic layer disposed as a top-most layer of the first buffer layer 130 among inorganic layers included in the first buffer layer 130. That is, when the inorganic layer disposed a top-most layer of the first buffer layer 130 is formed of SiON, the plurality of inorganic layers 181, 183, 185 and 187 may each be formed of SiON. Thus, in one embodiment, an end or edge portion of at least one of the plurality of inorganic layers in the encapsulation layer 180 and at least a portion of the first buffer layer 130 may be in contact with each other or may be joined together with one or more layers in between the encapsulation layer 180 and the first buffer layer 130 to encapsulate the first TFT T1, second TFT T2, and the OLED. In other embodiments, the edge portion of the encapsulation layer 180 and at least a portion of the first buffer layer 130 may be joined together at a portion between the first TFT T1 and the second TFT T2 with one or more layers in between the encapsulation layer 180 and the first buffer layer 130 to encapsulate the first TFT T1 and the OLED, although not shown in FIG. 6. The one or more layers may include any other inorganic layer of the plurality of inorganic layers in the encapsulation layer 180.

According to the fifth embodiment of the present invention, since the encapsulation layer 180 having a structure where the plurality of inorganic layers 181, 183, 185 and 187 and the plurality of organic layers 182, 184 and 186 are alternately stacked is provided and each of the plurality of inorganic layers 181, 183, 185 and 187 is formed of the same material as that of the first buffer layer 130, water is additionally prevented from penetrating into the organic light emitting display panel 100 from the outside in comparison with the first embodiment described above with reference to FIG. 2. Accordingly, characteristic of a first TFT T1 and the second TFT T2 is prevented from being degraded, and reliability of the first and second TFTs T1 and T2 is enhanced.

Figure 7:
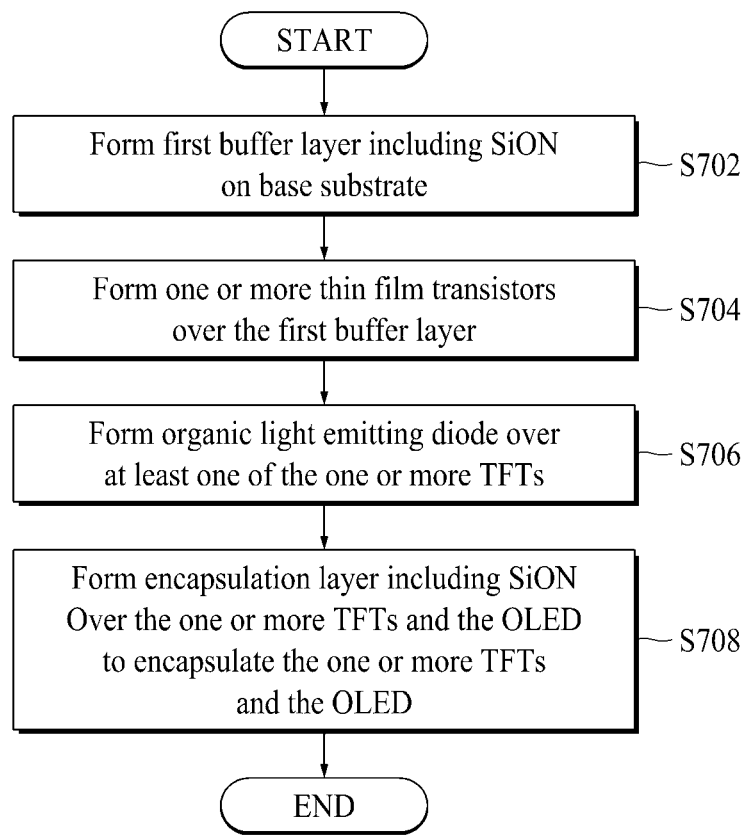
FIG. 7 is a flowchart illustrating a method of manufacturing an organic light emitting display device, according to one embodiment.

FIG. 7 is a flowchart illustrating a method of manufacturing an organic light emitting display device, according to one embodiment.

A first buffer layer including silicon oxynitride (SiON) is formed S702 over a base substrate. In one embodiment, forming the first buffer layer may include forming a plurality of inorganic layers of the first buffer layer. The top-most layer of the inorganic layers of the first buffer layer may include SiON. Subsequently, one or more thin film transistors (TFT) are formed S704 over the first buffer layer. An organic light emitting diode (OLED) is formed S706 over at least one of the one or more TFTs.

An encapsulation layer including SiON is formed S708 over the one or more TFTs and the OLED to encapsulate the one or more TFT's and the OLED. In one embodiment, forming the encapsulation layer may include forming a plurality of inorganic layers and a plurality of organic layers of the encapsulation layer, in which the plurality of organic layers are alternately stacked in between the plurality of inorganic layers. Each of the plurality of inorganic layers of the encapsulation layer may include SiON.

The encapsulation layer is formed such that at least a portion of the first buffer layer and an edge portion of the encapsulation layer are in contact with each other, or joined together with one or more layers including SiON in between the portion of the first buffer layer and the edge portion of the encapsulation layer to encapsulate the one or more thin film transistors and the OLED.

In one embodiment, a passivation layer of the one or more layers that covers the one or more TFTs and includes SiON may be formed after forming the one or more TFTs and before forming the OLED. In another embodiment, an interlayer dielectric of the one or more layers that includes SiON may be formed after forming the first buffer layer and before forming the passivation layer.

Figure 8:
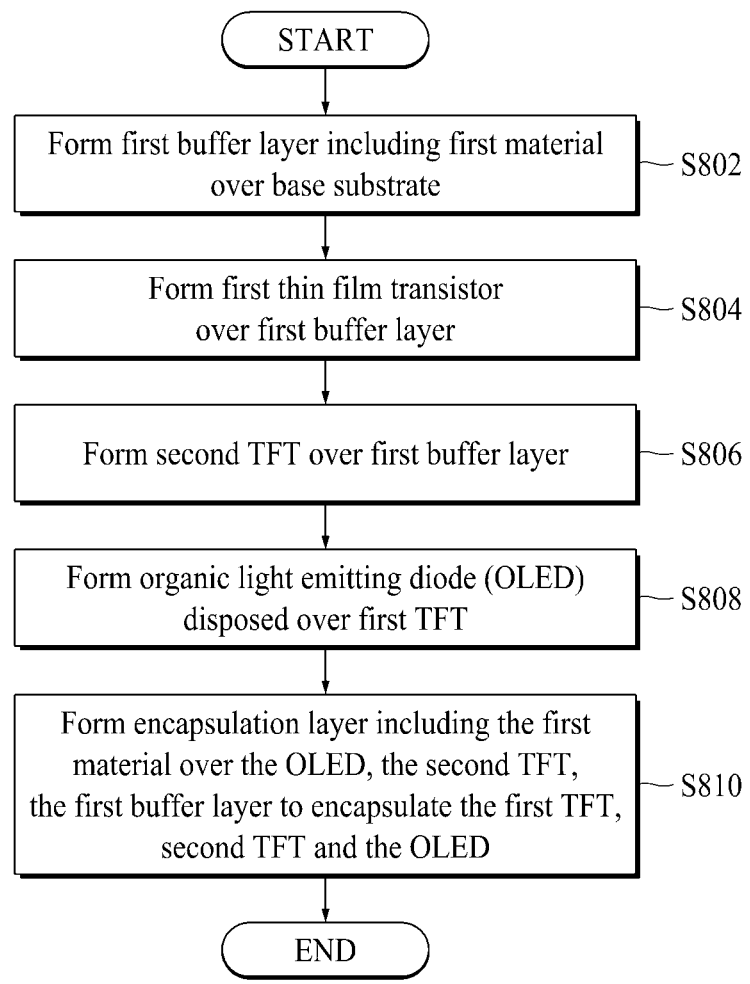
FIG. 8 is a flowchart illustrating a method of manufacturing an organic light emitting display device, according to another embodiment.

FIG. 8 is a flowchart illustrating a method of manufacturing an organic light emitting display device, according to another embodiment.

A first buffer layer including a first material is formed S802 over a base substrate. In one embodiment, forming the first buffer layer may include forming a plurality of inorganic layers of the first buffer layer. The top-most layer of the inorganic layers of the first buffer layer may include the first material. A first thin film transistor (TFT) is formed S804 over the first buffer layer and a second TFT is formed S806 over the first buffer layer. An organic light emitting diode (OLED) is formed S808 to be disposed over the first TFT.

An encapsulation layer including the first material is formed S810 over the OLED, the second TFT, and the first buffer layer to encapsulate the first TFT, the second TFT, and the OLED. In one embodiment, forming the encapsulation layer may include forming a plurality of inorganic layers and a plurality of organic layers of the encapsulation layer, in which the plurality of organic layers are alternately stacked in between the plurality of inorganic layers. Each of the plurality of inorganic layers of the encapsulation layer may include the first material.

The encapsulation layer is formed such that at least a portion of the first buffer layer and an edge portion of the encapsulation layer are in contact with each other, or joined together with one or more layers including the first material in between the portion of the first buffer layer and the edge portion of the encapsulation layer to encapsulate the first TFT, second TFT, and the OLED. In other embodiments, the edge portion of the encapsulation layer and at least a portion of the first buffer layer may be joined together at a portion between the first TFT and the second TFT with one or more layers in between the encapsulation layer and the first buffer layer to encapsulate the first TFT and the OLED.

In one embodiment, a passivation layer of the one or more layers that covers the second TFT and includes the first material may be formed after forming the second TFT and before forming the OLED. In another embodiment, an interlayer dielectric of the one or more layers that also includes the first material may be formed after forming the first buffer layer and before forming the passivation layer.

As described above, according to the embodiments of the present invention, the encapsulation layer and the first buffer layer may be formed of the same material, thereby increasing an interface adhesive force between the encapsulation layer and the first buffer layer which contact each other in an outermost portion of the organic light emitting display panel. Therefore, water is more effectively prevented from penetrating into the organic light emitting display panel than the related art where the encapsulation layer and the first buffer layer are formed of different materials. Accordingly, characteristic of the first and second TFTs is prevented from being degraded, and reliability of the first and second TFTs is enhanced.

Moreover, according to the embodiments of the present invention, the first buffer layer may have a stacked structure including $SiO_2$ and SiON which are lower in hydrogen content than SiNx, and SiON may be disposed on an uppermost portion of the first buffer layer. In this case, since a water vapor transmission rate of SiON is low, water is prevented from penetrating into the organic light emitting display panel through the base substrate. Accordingly, characteristic of the first and second TFTs is prevented from being degraded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate;
a first buffer layer disposed on the substrate, the first buffer layer comprising a first material;
a first thin film transistor (TFT) disposed on the first buffer layer;
a second TFT disposed on the first buffer layer;
an organic light emitting diode (OLED) disposed on the first TFT and electrically connected to the first TFT; and
an encapsulation layer disposed on the OLED, the first TFT, and the first buffer layer, the encapsulation layer comprising a plurality of inorganic layers and a plurality of organic layers alternately stacked in between the plurality of inorganic layers, at least one of the plurality of inorganic layers comprising the first material, and
wherein at least a portion of the first buffer layer and an edge portion of the encapsulation layer are in contact with each other, or joined together with one or more layers comprising the first material in between the portion of the first buffer layer and the edge portion of the encapsulation layer, to encapsulate at least the first TFT and the OLED.

2. The organic light emitting display device of claim 1, wherein the first material is silicon oxynitride (SiON).

3. The organic light emitting display device of claim 1, wherein the substrate is a plastic film.

4. The organic light emitting display device of claim 1, further comprising a second buffer layer disposed between the first buffer layer and the first TFT, and between the first buffer layer and the second TFT.

5. The organic light emitting display device of claim 1, wherein
the first buffer layer comprises a plurality of inorganic layers, a top-most layer of the inorganic layers of the first buffer layer comprising the first material.

6. The organic light emitting display device of claim 1, further comprising an adhesive layer disposed on the encapsulation layer.

7. The organic light emitting display device of claim 6, wherein the adhesive layer comprises a metal layer or a barrier film.

8. The organic light emitting display device of claim 1, wherein the one or more layers comprises a passivation layer provided between the first buffer layer and the encapsulation layer, the passivation layer covering the first TFT and the first buffer layer, the passivation layer comprising the first material.

9. The organic light emitting display device of claim 8, wherein the one or more layers further comprises an interlayer dielectric provided between the first buffer layer and the passivation layer, the interlayer dielectric comprising the first material.

10. The organic light emitting display device of claim 1, wherein each of the plurality of inorganic layers comprises the first material.

11. The organic light emitting display device of claim 10, wherein an edge portion of a top-most layer of the encapsulation layer is in contact with the portion of the first buffer layer.

12. The organic light emitting display device of claim 10, wherein the plurality of inorganic layers includes a top-most layer of the encapsulation layer and a bottom-most layer of the encapsulation layer.

13. An organic light emitting display device comprising:
a substrate;
a first buffer layer disposed on the substrate, the first buffer layer comprising silicon oxynitride (SiON);
one or more thin film transistors disposed over the first buffer layer;
an organic light emitting diode (OLED) disposed over and electrically coupled with at least one of said thin film transistors; and
an encapsulation layer disposed over the one or more thin film transistors and the OLED, the encapsulation layer also comprising SiON,
wherein at least a portion of the first buffer layer and an edge portion of the encapsulation layer are in contact with each other, or are joined together with one or more layers comprising SiON in between the portion of the first buffer layer and the edge portion of the encapsulation layer to encapsulate the one or more thin film transistors and the OLED.

14. The organic light emitting display device of claim 13, further comprising a second buffer layer disposed between the first buffer layer and the one or more thin film transistors.

15. The organic light emitting display device of claim 13, wherein
the first buffer layer comprises a plurality of inorganic layers, a top-most layer of the inorganic layers of the first buffer layer comprising SiON.

16. The organic light emitting display device of claim 13, wherein the one or more layers comprises a passivation layer provided between the first buffer layer and the encapsulation layer, the passivation layer covering the one or more thin film transistors and comprising SiON.

17. The organic light emitting display device of claim 16, wherein the one or more layers further comprises an interlayer dielectric provided between the first buffer layer and the passivation layer, the interlayer dielectric comprising SiON.

18. The organic light emitting display device of claim 13, wherein
the encapsulation layer comprises a plurality of inorganic layers and a plurality of organic layers alternately stacked in between the plurality of inorganic layers, each of the plurality of inorganic layers comprising SiON.

19. The organic light emitting display device of claim 18, wherein the plurality of inorganic layers includes a top-most layer of the encapsulation layer and a bottom-most layer of the encapsulation layer.

20. The organic light emitting display device of claim 18, wherein an edge portion of a top-most layer of the encapsulation layer is in contact with the portion of the first buffer layer, the bending part of the flexible display panel is pre-bent according to bending of the bridge.

21. The organic light emitting display device of claim 1, wherein the encapsulation layer is disposed on the OLED of a display area, and the second TFT of a non-display area.

22. The organic light emitting display device of claim 14,
wherein the one or more thin film transistors comprises a first thin film transistor (TFT) disposed on the first buffer layer of a display area, and a second TFT disposed on the first buffer layer of a non-display area,
wherein the OLED is disposed on the first TFT, and
wherein the encapsulation layer is disposed on the OLED of the display area and the second TFT of the non-display area.

* * * * *